United States Patent
Sed'a et al.

(10) Patent No.: US 10,790,113 B2
(45) Date of Patent: Sep. 29, 2020

(54) MULTI-BEAM CHARGED PARTICLE IMAGING APPARATUS

(71) Applicant: FEI Company, Hillsboro, OR (US)

(72) Inventors: Bohuslav Sed'a, Eindhoven (NL); Ali Mohammadi-Gheidari, Eindhoven (NL); Marek Unčovský, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/451,319

(22) Filed: Jun. 25, 2019

(65) Prior Publication Data

US 2019/0393013 A1  Dec. 26, 2019

(30) Foreign Application Priority Data

Jun. 25, 2018  (EP) .................................... 18179687

(51) Int. Cl.
| | |
|---|---|
| *H01J 37/09* | (2006.01) |
| *H01J 37/10* | (2006.01) |
| *H01J 37/147* | (2006.01) |
| *H01J 37/20* | (2006.01) |
| *H01J 37/04* | (2006.01) |

(52) U.S. Cl.
CPC ............ *H01J 37/09* (2013.01); *H01J 37/045* (2013.01); *H01J 37/10* (2013.01); *H01J 37/1474* (2013.01); *H01J 37/20* (2013.01); *H01J 2237/0453* (2013.01); *H01J 2237/30472* (2013.01)

(58) Field of Classification Search
CPC .......... H01J 37/045; H01J 37/09; H01J 37/10; H01J 37/1474; H01J 37/20; H01J 37/28; H01J 2237/0453; H01J 2237/30472
See application file for complete search history.

(56) References Cited

U.S. PATENT DOCUMENTS

| | | | | |
|---|---|---|---|---|
| 2011/0272576 A1* | 11/2011 | Otaki | ..................... | B82Y 10/00 |
| | | | | 250/306 |
| 2013/0187046 A1* | 7/2013 | Zeidler | .................. | B82Y 40/00 |
| | | | | 250/310 |
| 2013/0299697 A1* | 11/2013 | Enyama | .................. | H01J 37/12 |
| | | | | 250/307 |

FOREIGN PATENT DOCUMENTS

EP  2622626  8/2013

* cited by examiner

*Primary Examiner* — David E Smith

(57) ABSTRACT

A charged particle imaging apparatus comprising:
A specimen holder, for holding a specimen;
A particle-optical column, for:
  Producing a plurality of charged particle beams, by directing a progenitor charged particle beam onto an aperture plate having a corresponding plurality of apertures within a footprint of the progenitor beam;
  Directing said beams toward said specimen,
wherein:
  Said aperture plate comprises a plurality of different zones, which comprise mutually different aperture patterns, arranged within said progenitor beam footprint;
  The particle-optical column comprises a selector device, located downstream of said aperture plate, for selecting a beam array from a chosen one of said zones to be directed onto the specimen.

15 Claims, 4 Drawing Sheets

MULTI-BEAM CHARGED PARTICLE IMAGING APPARATUS

The invention relates to a charged particle imaging apparatus comprising:
 A specimen holder, for holding a specimen;
 A particle-optical column, for:
  Producing a plurality of charged particle beams, by directing a progenitor charged particle beam onto an aperture plate having a corresponding plurality of apertures within a footprint of the progenitor beam;
  Directing said beams toward said specimen.

The invention also relates to a method of using such an apparatus.

Examples of charged particle imaging apparatus include Charged Particle Microscopes (CPMs) and charged particle lithography imaging systems (used interalia to write integrated circuit patterns onto photoresist-coated semiconductor substrates). Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. More specifically:
 In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
 In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.
 A SEM can also be used in "transmission mode", e.g. when using relatively thin samples and a relatively high incident beam energy. Such a tool is often called a "TSEM" (Transmission SEM), and it will typically have a relatively rudimentary imaging system (e.g. a single lens and deflector) disposed between the specimen and post-specimen detector.

As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions (such as oxygen), protons and positrons, for instance.

It should be noted that, in addition to imaging and performing (localized) surface modification (e.g. milling, etching, deposition, etc.), a CPM may also have other functionalities, such as examining diffractograms, conducting spectroscopy, studying ion channeling/ion backscattering (Rutherford Backscattering Spectrometry), etc.

In a lithography imaging system (e.g. wafer stepper/wafer scanner), an actinic beam of radiation is used to pattern an energy-sensitive layer of material (photoresist) that has been provided (e.g. spin-coated) on a surface of a substrate (e.g. semiconductor wafer). Traditionally, the actinic beam has comprised a broad beam of photons (e.g. from a mercury lamp or laser), which pass through a mask/reticle and impart its pattern onto the photosensitive later. However, other types of lithography imaging system make use of charged particles, such as so-called "direct write" electron beam tools, which trace one or more electron beams over the photosensitive layer according to the desired pattern. Still other lithography imaging system concepts make use of ion beams.

In all cases, a charged particle imaging apparatus will comprise at least the following components:
 A charged particle source, such as:
  A Field Emission Gun (FEG; Schottky or Cold FEG) or $LaB_6$ thermal source, for example, in the case of electrons;
  A Liquid Metal Ion Source (LMIS), Nano-Aperture Ion Source (NAIS) or RF-generated ion plasma source, for example, in the case of ions.
 A particle-optical column (illuminator), which serves to manipulate a "raw" particle beam from said source and perform upon it certain operations such as focusing, aberration mitigation, cropping (with a diaphragm), filtering, etc. It will generally comprise one or more (charged-particle) lenses, and may comprise other types of (particle-)optical component also. If desired, the illuminator can be provided with a deflector system that can be invoked to cause its exit beam to perform a scanning motion across the specimen being investigated.
 A specimen holder, on which a specimen under investigation can be held and positioned (e.g. tilted, rotated). If desired, this holder can be moved so as to effect scanning motion of the specimen w.r.t. the beam. In general, such a specimen holder will be connected to a positioning system. When designed to hold cryogenic specimens, the specimen holder can comprise means for maintaining said specimen at cryogenic temperatures, e.g. using an appropriately connected cryogen vat.

A transmission-type CPM, such as a (S)TEM or TSEM, or a mask-based lithography imaging system will additionally comprise:
 An imaging system, which essentially takes charged particles that are transmitted through a specimen (plane) [or mask plane, in lithography] and directs (focuses) them onto a target such as a detection/imaging device, spectroscopic apparatus, resist-coated wafer, etc. As with the illuminator referred to above, the imaging system may also perform other functions, such as aberration mitigation, cropping, filtering, etc., and it will generally comprise one or more charged-particle lenses and/or other types of particle-optical components.

Conventional charged particle imaging apparatus has made use of unitary imaging beams. However, in recent years, multi-beam apparatus designs have begun to emerge. Moreover, multi-electron-beam lithography imaging systems are, for example, being developed and marketed by the firm Mapper Lithography B.V., Delft, The Netherlands. The basic idea behind the simultaneous use of several primary beams—as opposed to just a single beam—is that it promises significant throughput improvement, since the use of an array of beams allows "parallel imaging". However, the concurrent use of multiple imaging beams (beamlets; subbeams; component beams) also presents various technical problems and challenges, which need to be addressed satisfactorily. Examples of areas in which such problems arise include multi-beam generation/adjustment and aberration control.

It is an object of the invention to provide an improved multi-beam charged particle imaging apparatus. More specifically, it is an object of the invention that such an apparatus should allow more flexible multi-beam generation/adjustment than prior-art microscopes. In particular, it is an object of the invention to provide an innovative way of adjusting beam current/beam modality in such an apparatus.

These and other objects are achieved in an apparatus as set forth in the opening paragraph above, characterized in that:
Said aperture plate comprises a plurality of different zones, which comprise mutually different aperture patterns, arranged within said progenitor beam footprint;
The particle-optical column comprises a selector device, located downstream of said aperture plate, for selecting a beam array from a chosen one of said zones to be directed onto the specimen.

Conventional particle-optical column designs tend to comprise one or more beam crossovers, in which the beam envelope converges (is focused) through a "waist" (of minimal width) before diverging again. Such a crossover can be a convenient location in/near which to place an adjustable aperture, whose width can be varied so as to curtail/re-enlarge the waist width and, with it, the total beam current. Such a current adjustment mechanism is, in principle, exploitable in both single-beam and multi-beam particle-optical designs. However, for multi-beam designs, in which the cumulative beam current tends to be much higher than for single-beam designs, such crossovers (and, particularly, the beam paths converging to/diverging from them) represent locations where the degree of Coulomb interaction between charged particles in the various beams can become unacceptable, with significant blur and loss of image brightness as attendant effects. For this reason, it can be desirable in multi-beam designs to avoid beam crossovers, if possible. However, when crossovers are avoided, the convenient beam current adjustment mechanism referred to above becomes defunct.

The apparatus design of the present invention provides a solution to this problem, in addition to solving other problems and providing other functionalities. More specifically, in an embodiment of the invention, at least two of said zones in the aperture plate have an essentially identical aperture distribution but differ as regards a diameter of the apertures in that distribution. Put another way: if a central point in each aperture defines a reference "node", then the nodes in (at least) two zones $Z_A$ and $Z_B$ have the same distribution (array/matrix arrangement), but the size of the apertures centered on each node differs between $Z_A$ and $Z_B$. Having different aperture sizes in this way—for an identical/common aperture distribution—allows adjustment of the beam current value for all component beams in the multi-beam array. For example, each of $Z_A$ and $Z_B$ might comprise a regular orthogonal or hexagonal array of apertures, but with respective aperture widths of 5 μm and 20 μm, for instance.

In another embodiment of the invention, one of said zones comprises a singular through-hole, for allowing passage of a portion of said progenitor (precursor; initial) beam without subdividing it (with reference to the terminology used above, it will be understood that the beam "array" emanating from a zone with a single through-hole will here comprise just one member beam). The presence of such a through-hole advantageously allows the apparatus to be used in single-beam rather than multi-beam mode, when desired. This can, for example, be useful if a multi-beam implementation of a single-beam architecture suffers from certain sub-optimal aspects, in which case it can be desirable to be able to revert to a single-beam mode when required. For example, a multi-beam SEM does not readily lend itself to allowing specimen tilt, and it can also require more complicated detector architectures (e.g. for differentiated backscattered electron detection) than a single-beam ("conventional") SEM; in this regard, one can readily grasp the attractiveness of being able to easily revert to single-beam mode when necessary/desired, since such functionality/multiple modality offers a "best of both worlds" advantage, and increases the number of applications for which the inventive apparatus can be used. If desired, the aperture plate may comprise a plurality of different zones with different such "single-beam" through-holes—of a variety of diameters—so as to realize single beams with different beam currents. Alternatively, one could just use a single zone endowed with a (relatively large) through-hole, and use an adjustable opening downstream of the aperture plate (e.g. in the selector device) to reduce/curtail the beam diameter when a lower single-beam current is required (see FIG. 3, for example). In yet another possible scenario, an adjustable lens assembly—located between the aperture plate and selector device—can be used to control the size of the single-beam spot ultimately impinging on the specimen. Various combinations/hybrids of these various approaches are, of course, also possible. The plurality of selectable zones $\{Z_i\}$ in the inventive aperture plate also allows other effects/advantages to be achieved. For example:

Two different zones $Z_1$, $Z_2$, could have an identical aperture size and fundamental aperture distribution geometry (e.g. orthogonal), but could differ as regards the numbers/spacings of their apertures—for instance, $Z_1$ might have an n×n aperture array, whereas $Z_2$ might have an m×m array, with n # m.

Two different zones $Z_H$, $Z_K$, could have different fundamental aperture distribution geometries—for instance, $Z_H$ might have an orthogonal aperture distribution, whereas $Z_K$ might have a hexagonal ("honeycomb") aperture distribution.

This can, for example, be desirable in lithographic imaging applications, in which it may be desirable to be able to tailor the beam configuration (aperture distribution geometry) to a particular integrated circuit layout being imaged, e.g. in terms of non-isotropy of dense/non-dense lines, line direction, etc. In addition, it allows beam configuration to be matched to crystallographic orientation/dimensioning of a particular specimen, for example.

As regards the selector device of the present invention, this is advantageously positioned downstream of (i.e. after) the aperture plate. This means that the selector device can be located out of the vicinity of the charged particle source—which is an environment that is generally characterized by very high (ultra-high) vacuum and high voltage levels. These aspects make it difficult/impractical to locate/operate non-essential subsystems in the source vicinity. For example, the very high vacuum levels in the source vicinity (typically ~$10^{-9}$ mbar for a Schottky FEG and ~$10^{-10}$-$10^{-11}$ mbar for a CFEG, for instance) place significant restrictions on material compatibility (as regards outgassing/bake-out durability) and vacuum feedthroughs, and limit choices as regards motor/actuator types and wiring, for instance. Concurrently, the high voltage levels in the source vicinity (e.g. up to ~300 kV in the case of a STEM) place restrictions on the types/locations of structures used, such as metallic electrodes and/or actuation rods, for example (which can cause arc-over if not properly designed/implemented). Such considerations would make it difficult to construct a practicable, satisfactorily operating selector device upstream of the aperture plate. However, downstream of the aperture plate, conditions are much more conducive, since:

There is no high voltage source in this area;

The vacuum here is generally not as high, with typical values of ~$10^{-7}$ mbar in the vicinity of the specimen, and as low as $10^{-5}$ mbar in the beam tube. At these values, outgassing is generally not a significant issue, bake-out is generally not required, and one thus has much greater choice as regards materials/construction.

It is therefore much easier to realize satisfactorily performing electrical/magnetic/mechanical systems in this area, as will now be set forth in more detail.

Since the progenitor beam in the inventive apparatus passes through multiple zones of the aperture plate at once, a primary task of the selector device is to select a particular zone that will be allowed to illuminate the specimen, while simultaneously preventing other zones from so doing; in this context, the selector device thus acts as a zone selection mechanism. Put another way, if the beam collection/envelope emerging from the aperture plate is considered to have a reference cross-section, then the selector device serves to define only a particular (selectable) portion of this cross-section for further admittance to the specimen. In an embodiment of the invention, the selector device comprises a masking plate with a restrictive opening that can be positioned so as to pass to the specimen only a selected beam array (beam segment) from a chosen zone. Conveniently, such a masking plate may, if desired, be connected to a motor (or other actuator) to controllably position the masking plate/restrictive opening relative to the reference cross-section of the beam/the particle-optical axis of the column. The restrictive opening may be shaped/sized to match/complement the shape/size of the various zones in the aperture plate (taking column magnification into account). Moreover, if desired, multiple restrictive openings may be present, with a particular one being chosen as required/desired. See FIG. 3, for instance. A masking plate as here described is conveniently located at a plane in which the (beams from the) various zones of the aperture plate are relatively well separated from one another—which inter alia simplifies the dimensioning/manufacture of such a masking plate.

In a refinement of the embodiment in the previous paragraph, the selector device additionally comprises a deflector assembly, located (at a discretionary position) prior to the aforementioned masking plate, for deflecting the beam envelope relative to the masking plate so as to direct through said restrictive opening only said selected beam array from said chosen zone. Such a deflector assembly may, for example, comprise one or more sets of electrostatic and/or magnetic deflectors to controllably position the beam cross-section relative to the masking plate/restrictive opening. In a refinement of this basic approach, deflectors are paired so that a given deflection introduced (by a first deflector set) prior to the masking plate is compensated/annulled (by a second deflector set) after the masking plate, thereby ensuring beam impingement upon the specimen with no residual (angular) deflection.

The invention is advantageously applied in scanning systems, which comprise a scanning assembly for producing relative scanning motion of the specimen and beam array. According to choice, such scanning can entail moving the beam array relative to the specimen, or moving the specimen relative to the beam array, or a combination of both. In conventional SEMs/STEMs, for example, scanning motion is usually effected solely via beam deflection rather than specimen displacement. On the other hand, in conventional lithography imaging systems, it is more usual to move the specimen using a scanning stage. If beam scanning is used, the employed scan deflectors can be conveniently located downstream of the selector device of the current invention (see FIG. 1, for example). Depending on the exact set-up used, there are certain reasons why it may be more advantageous to select (predominantly) specimen scanning as opposed to (predominantly) beam scanning, e.g. as set forth in the aforementioned co-pending application EP18176596.7.

As regards the number of input beams in the beam array used in the present invention, it should be emphasized that this is discretionary. On the one hand, the greater the number of beams, the greater the throughput enhancement that can be achieved; on the other hand, a greater number of beams will increase overall system complexity. The skilled artisan will be able to find a compromise between these competing effects, and choose a number that is appropriate to a given scenario/use case. For example, one can construct a satisfactory system using 196 beams in a 14×14 array—though many other beam pluralities/configurations are possible.

The invention will now be elucidated in more detail on the basis of exemplary embodiments and the accompanying schematic drawings, in which:

FIG. 1 renders a longitudinal cross-sectional elevation view of an embodiment of a charged particle imaging apparatus—in this case, an electron microscope—in which the present invention is implemented.

In the Figures, where pertinent, corresponding parts are indicated using corresponding reference symbols.

EMBODIMENT 1

Figure 1:
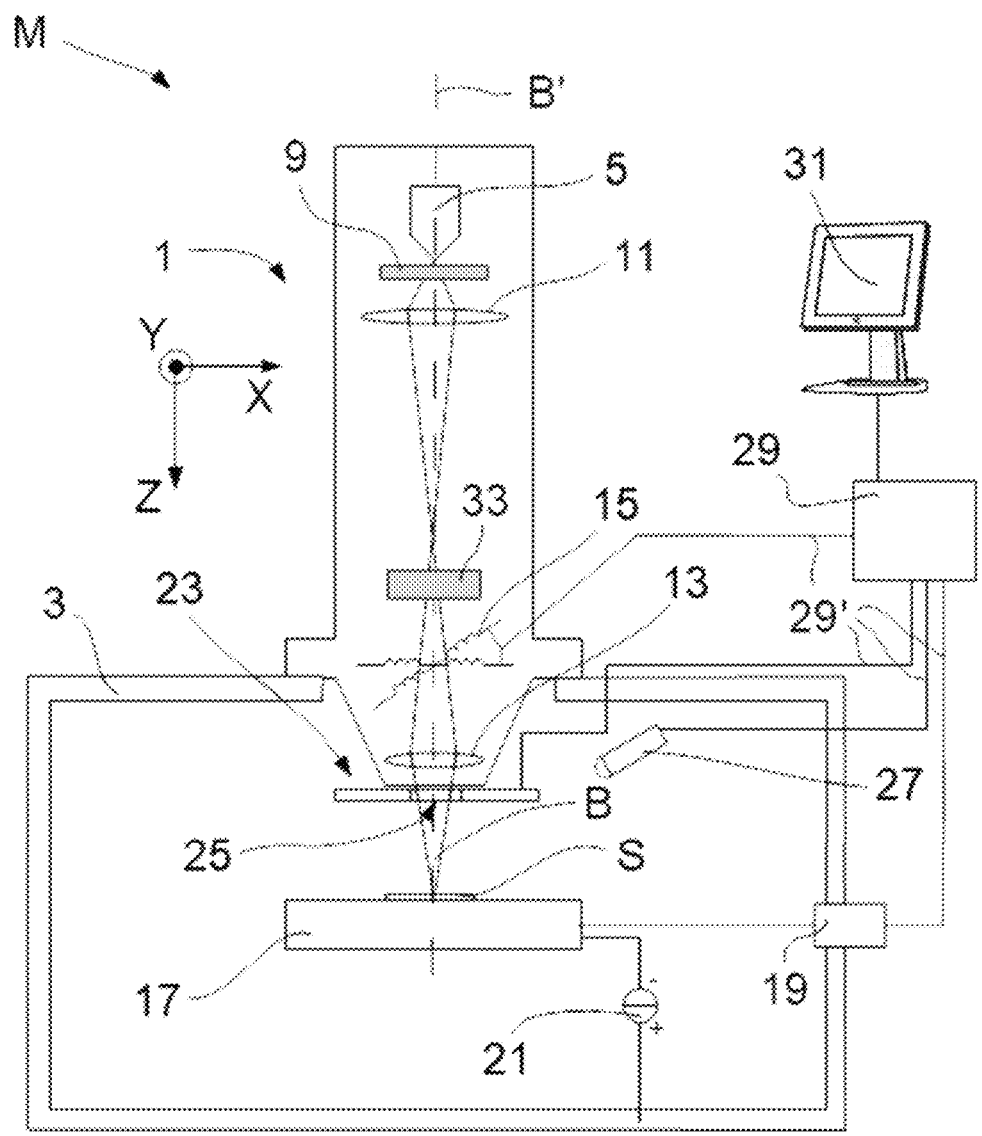

FIG. 1 (not to scale) is a highly schematic depiction of an embodiment of charged particle imaging apparatus in which the present invention is exploited; more specifically, it shows an embodiment of a SEM-though, in the context of the current invention, it could also be a STEM or a lithography imaging system, for example. The microscope M comprises a particle-optical column/illuminator 1, which produces an electron beam (charged particle beam) that propagates along a particle-optical axis B'. The particle-optical column 1 is mounted on a vacuum chamber 3, which comprises a specimen holder 17 and associated stage/actuator 19 for holding/positioning a specimen S. The vacuum chamber 3 is evacuated using vacuum pumps (not depicted). With the aid of voltage source 21, the specimen holder 17, or at least the specimen S, may, if desired, be biased (floated) to an electrical potential with respect to ground.

The particle-optical column 1 comprises an electron source (charged particle source) 5 (such as a Schottky emitter, cold FEG or LaB$_6$ filament, for example), lenses 11, 13 to focus the electron beam onto the specimen S, and a deflection unit 15 to perform beam deflection/scanning of the beam. By scanning an electron beam over the specimen S, output radiation—comprising, for example, a flux of X-rays, infrared/visible/ultraviolet light, secondary electrons and/or backscattered electrons—emanates from the specimen S. Detectors 23, 27 can be chosen from a variety of possible detector types that can be used to examine different types/modalities of such output radiation. In the apparatus depicted here, the following detector choices have been made:

Detector 23 is a segmented electron detector, comprising a plurality of independent detection segments (e.g. quadrants) disposed about a central aperture 25 (encompassing the optical axis B'). Such a detector can, for example, be used to investigate the angular dependence of a flux of electrons emerging from the specimen S.

Detector 27 is, for example, an X-ray detector, which can be used to register X-rays emanating from the specimen S, and thus perform Energy-Dispersive X-ray Spectroscopy (EDX). It could alternatively be a cathodoluminescence detector, for example.

Alternatively/supplementally, use could be made of a backscattered electron detector as set forth in the aforementioned co-pending patent application EP18176596.7, for example. Since the detected output radiation is position-dependent (due to said scanning motion), the information obtained from the detectors 23, 27 will also be position-dependent, and can thus be used to assemble an image that is basically a map of detector output as a function of scan-path position on the specimen S. The signals from the detectors 23, 27 pass along control lines (buses) 29", are processed by the controller 29, and displayed on display unit 31. Such processing may include operations such as combining, integrating, subtracting, false colouring, edge enhancing, and other processing known to the skilled artisan. In addition, automated recognition processes (e.g. as used for particle analysis) may be included in such processing.

Various refinements and alternatives of such a "basic" set-up will be known to the skilled artisan, including, but not limited to:

The use of dual primary beam species—for example an electron beam for imaging and an ion beam for machining (or, in some cases, imaging) the specimen S;

The use of a controlled environment at the specimen S—for example, maintaining a pressure of several mbar (as used in a so-called Environmental SEM) or by admitting gases, such as etching or precursor gases.

Figure 2:
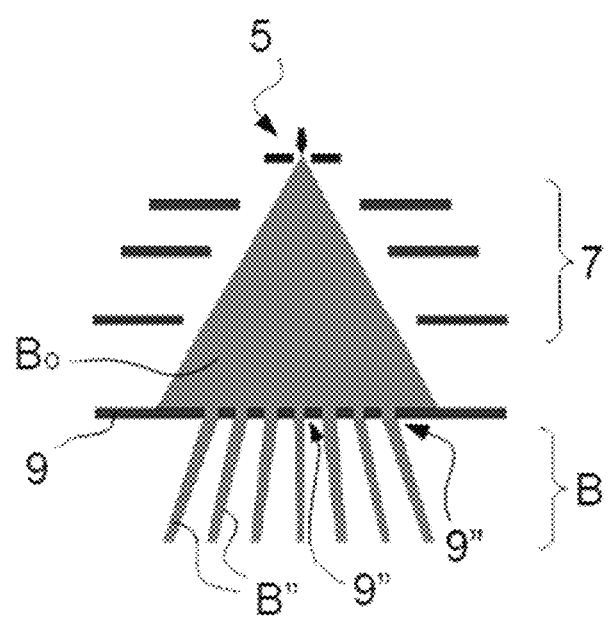
FIG. 2 illustrates a manner in which an electron beam array can be generated from a single progenitor beam.

Of importance to the present invention is the fact that a single primary electron beam as used in a conventional SEM—is here replaced by a multi-beam array. FIG. 2 shows how such a multi-beam array can be generated, using a relatively small modification to FIG. 1. A progenitor electron beam B$_o$ leaves the electron source 5, traverses a series of (extraction/acceleration) electrodes 7, and impinges upon an aperture plate 9, which contains a plurality of apertures 9"; such a structure 9 can also be referred to as an Aperture Lens Array (ALA)—since the apertures 9" have a lensing effect—and can, for example, be manufactured by using thin film (MEMS) technology to etch an array of small holes in a silicon sheet (see the aforementioned PhD thesis). As a result of impinging on the ALA 9, the progenitor beam B$_o$ is converted into a plurality B of sub-beams/beamlets/component beams B", in the same geometric configuration as the plurality of holes 9"' used to generate them. This beam array B then follows its course along axis B' through the illuminator 1, which directs it onto the specimen S (see FIG. 1).

Figure 3:
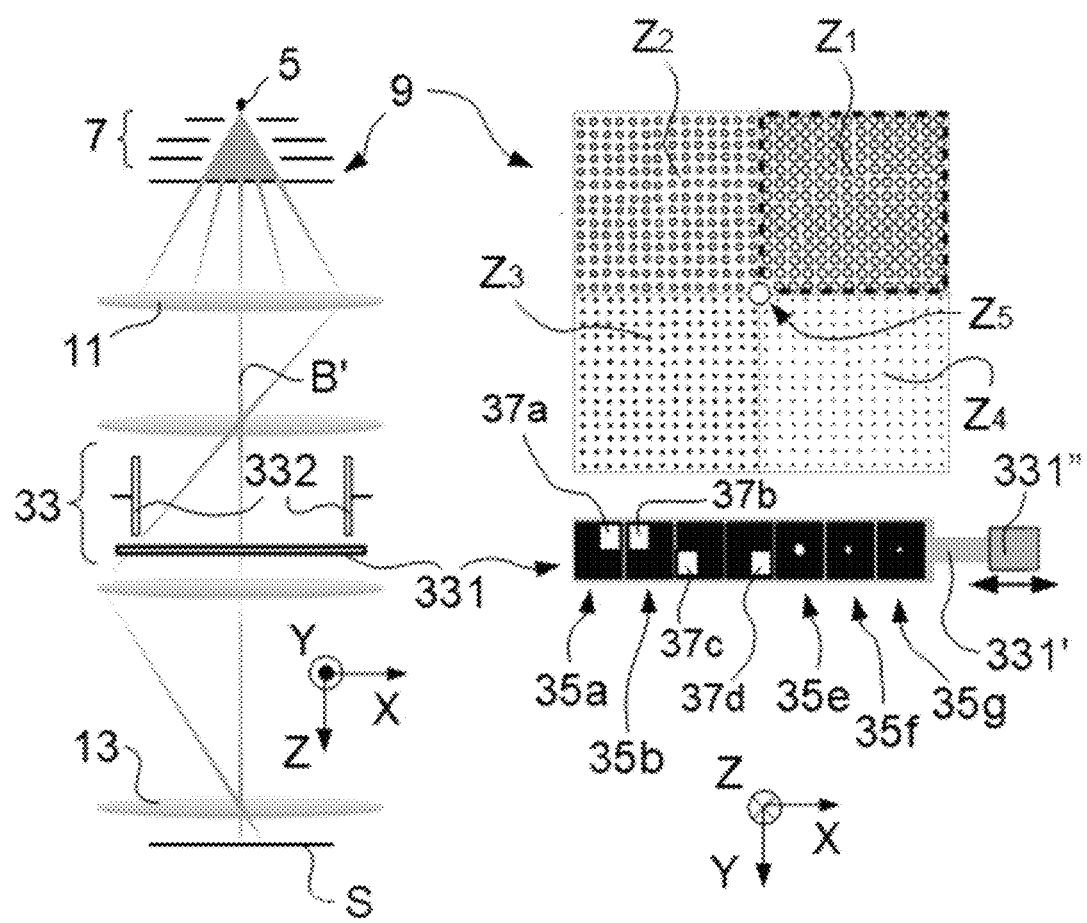
FIG. 3 shows elevation and plan views of various components disposed along the particle-optical axis in an embodiment of a charged particle apparatus according to the invention.

In the current invention, the ALA 9 takes a special form, in that it comprises a plurality of different zones {Z}—having mutually different aperture patterns—arranged within the beam footprint (upon the ALA 9) of progenitor beam B$_o$ (so that multiple zones are concurrently illuminated/traversed by beam B$_o$). An example of such a scenario is illustrated in FIG. 3, in which:

The left hand side of the Figure shows an elevation view of certain components disposed along the electron path (refer also to FIGS. 1 and 2);

The right hand side of the Figure shows separate plan views of two particular components not to the same scale—namely the ALA 9 and (part of) the selector device 33.

Starting with the inventive ALA 9, it is seen in the current example that this comprises five different zones, namely:

Four essentially square quadrant zones $Z_1$, $Z_2$, $Z_3$, $Z_4$. These each have a 14×14 orthogonal configuration of beam apertures, but they are mutually different as regards the diameters/widths of these apertures. More specifically, zone $Z_1$ has the largest apertures and zone $Z_4$ has the smallest, with zones $Z_2$ and $Z_3$ exhibiting a progression between these two extremal cases. For clarity, the perimeter of zone $Z_1$ is marked by a dashed outline; the other quadrant zones $Z_2$, $Z_3$, $Z_4$ are similarly defined, but their perimeters are not dashed, so as to avoid cluttering the Figure. In the set-up illustrated here, the beam apertures are circular, but this does not necessarily have to be the case, and other shapes (such as elliptical) are also possible.

A central zone $Z_5$ (located at the intersection/common corner of zones $Z_1$-$Z_4$), which here takes the form of a (relatively large) circular through-hole. This zone $Z_5$ allows use of the depicted apparatus in single-beam mode, if desired, as will be explained in more detail below.

Moving now to the inventive selector device 33, it is seen that this is located downstream of the ALA 9 (refer also to FIG. 1) and, in the current example, comprises two sub-components, namely a masking plate 331 and a beam deflector assembly 332. In this particular situation, the masking plate 331 comprises a movable strip 331', which can be positioned/moved within the beam path by an actuator 331", such as an electric motor. The illustrated strip 331' (which may, for example, be comprised of a thin sheet of (MEMS-processed) silicon) has (in this particular case) seven different regions, 35a, 35b, . . . , 35g, each of which has a corresponding restrictive opening 37a, 37b, . . . 37g. These openings (windows) 37a-37g have the following form:

In the case of four regions 35a, 35b, 35c, 35d, the corresponding openings 37a, 37b, 37c, 37d take the form of an open quadrant, though the relative positions of these open quadrants 37a-37d differs between the regions 35a-35d. Comparing the regions 35a-35d to zones $Z_1$-$Z_4$ of ALA 9, it is seen that openings 37a (upper right), 37b (upper left), 37c (lower left), 37d (lower right) positionally correspond to zones $Z_1$, $Z_2$, $Z_3$ and $Z_4$, respectively. The sizes of openings 37a-37d are matched to the sizes of zones $Z_1$-$Z_4$ at the plane in which selector device 33 is located.

In the case of three regions 35e, 35f, 35g, the corresponding openings 37e, 37f, 37g take the form of a central round hole, though the size of these round holes 37e-37g differs between the regions 35e-35g. Comparing the regions 35e-35g to ALA 9, it is seen that all openings 37e-37g positionally correspond to zone $Z_5$. The sizes of openings 37e-37g are tailored to the size of zone $Z_5$ at the plane in which selector device 33 is located, whereby:
- Largest opening 37e corresponds exactly to the size of $Z_5$ at this plane, or is slightly larger.
- Openings 37f, 37g are progressively smaller than opening 37e.

As regards the operation of the beam selector 33 in concert with the ALA 9, this essentially involves two aspects, namely:
- Moving masking plate 331 so as to place a chosen one of the restrictive openings 37a-37g close to/upon the particle-optical axis B';
- Invoking the beam deflector assembly 332—which may, for example, comprise a set of electrostatic deflection electrodes—to position (a beam array/beam cross-section portion emerging from) a selected one of the zones $Z_1$-$Z_5$ upon the restrictive opening in question.

It is evident that using masking plate 331 and deflector assembly 332 in this way (e.g. according to positional entries in a lookup table) will result in admission (and passage onward toward specimen S) of a beam array from a chosen one of the zones $Z_1$-$Z_5$. More specifically:
- In the case of zones $Z_1$-$Z_4$, since each of these zones contains apertures of a different width, they will each result in a different beam current value for the various beams constituting the orthogonal 14×14 multi-beam arrays concerned.
- In the case of zone $Z_5$, the beam current of this single-beam mode can be curtailed by selecting opening 37f or 37g rather than opening 37e.

The skilled artisan will understand that the specific one-to-one correspondence set forth above does not have to be rigidly adhered to; for example, a magnetic lens (assembly) located upstream of the masking plate 331 can be used to rotate the beam array impinging thereupon, thus potentially allowing (depending on the chosen degree of rotation) various different (quadrant-shaped) zones to be directed through a given restrictive opening, one at a time.

The particular dimensioning of the components 9 and 331, and of the apertures therein, will depend on various factors, such as the specific charged particle column design, desired beam current values, etc., and the skilled artisan will be well able to select values that suit the needs of a given situation. However, by way of providing some general guidance, the following non-binding examples may be considered:
- Typical diameters of individual apertures in zones $Z_1$-$Z_4$: ca. 1-50 μm.
- Typical diameter of through-hole in zone $Z_5$: ca. 50-300 μm.
- Typical diameters of restrictive openings 37a-37d: ca. 0.1-1.5 mm.
- Typical diameter of restrictive openings 37e-37g: ca. 4-200 μm.
- Typical area of ALA 9 impinged upon by progenitor beam Bo: up to ca. 1.5×1.5 mm².

As regards the ALA 9 and selector device 33, it should be explicitly noted that the examples illustrated and described here are non-binding, and that many alternatives are possible, e.g. as regards the number and relative positioning/arrangement of zones {Zi} in ALA 9, the manner in which such zones mutually differ from one another, the numbers/shapes of openings in strip 331', etc. See, in this regard, the next Embodiment, for example.

EMBODIMENT 2

Figure 4A:
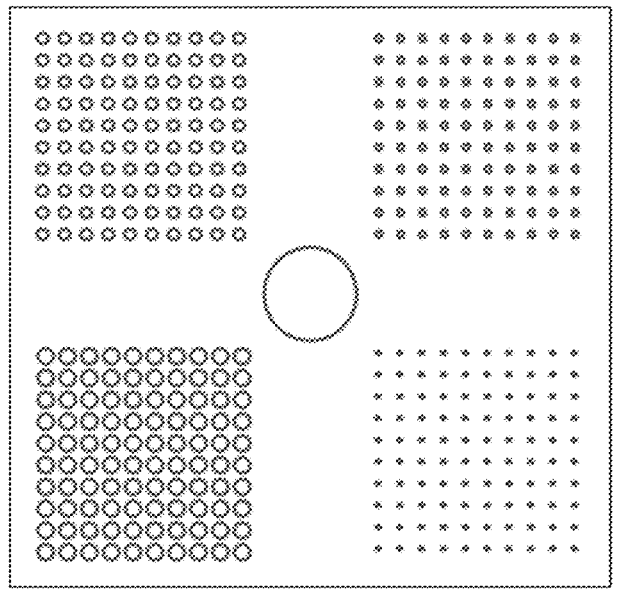
FIGS. 4A and 4B show alternative embodiments of possible aperture plates that can be used in embodiments of the present invention.
Figure 4B:
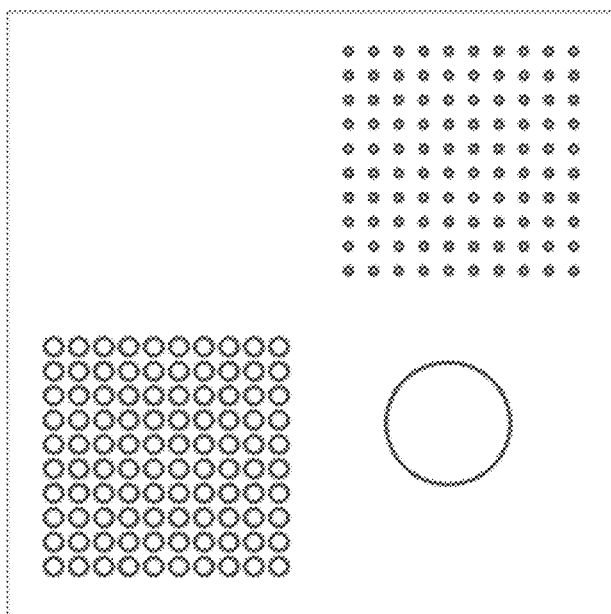

FIGS. 4A and 4B illustrate alternative embodiments of possible aperture plates that can be used in embodiments of the present invention. More specifically:
- FIG. 4A shows an aperture plate/ALA that is similar to ALA 9 in FIG. 3, in that it contains four quadrant-like zones with an orthogonal multi-beam configuration, nested about a single-beam through-hole. However, the mutual separation between the quadrant-like zones is bigger here, allowing a larger through-hole in the middle. Such an arrangement is a "roomier" alternative to the ALA 9 in FIG. 3.
- FIG. 4B shows a situation in which the single-beam through-hole has been moved from a central position and located instead in a quadrant of its own. Such an arrangement allows simplification of the attendant masking plate, if desired, since all zones of the ALA can now be "serviced" by a (movable) square or circular restrictive opening.

The invention claimed is:

1. A charged particle imaging apparatus comprising:
a specimen holder, for holding a specimen; and
a particle-optical column, configured to:
   produce a plurality of charged particle beams, by directing a progenitor charged particle beam onto an aperture plate having a corresponding plurality of apertures within a footprint of the progenitor charged particle beam; and
   direct the plurality of charged particle beams toward said specimen;
characterized in that:
   said aperture plate comprises a plurality of different zones arranged within said progenitor charged particle beam footprint, wherein the each of the plurality of different zones comprise mutually different aperture patterns; and
   the particle-optical column comprises a selector device, located downstream of said aperture plate, wherein the selector device is configured to select a beam array from a chosen zone of the plurality of different zones to be directed onto the specimen.

2. An apparatus according to claim 1, wherein at least two of said plurality of different zones have an essentially identical aperture distribution.

3. An apparatus according to claim 1, wherein one of said plurality of different zones comprises a singular through-hole, configured to allow passage of a portion of said progenitor charged particle beam without subdividing it.

4. An apparatus according to claim 3, wherein at least one of a variable opening in said selector device, and an adjustable lens assembly disposed between said aperture plate and said selector device, is used to curtail a beam current value of a beam passing through said singular through-hole in said aperture plate.

5. An apparatus according to claim 1, wherein said selector device comprises a masking plate with a restrictive opening that can be positioned so as to allow only the selected beam array from the chosen zone to pass to the specimen.

6. An apparatus according to claim 5, wherein said selector device further comprises a deflector assembly, located prior to the masking plate, wherein the deflector assembly is configured to deflect said plurality of beams relative to said masking plate so that only the selected beam array from the chosen zone is directed through said restrictive opening of the masking plate.

7. An apparatus according to claim 1, comprising a scanning assembly for producing a relative scanning motion of the specimen and beam array.

8. An apparatus according to claim 1, selected from a group comprising a charged particle microscope and a charged particle lithography imaging system.

9. A method of using a charged particle imaging apparatus comprising:
- a specimen holder, for holding a specimen;
- a particle-optical column, configured to:
  - produce a plurality of charged particle beams by directing a progenitor charged particle beam onto an aperture plate, wherein the aperture plate comprises:
    - a corresponding plurality of apertures within a footprint of the progenitor charged particle beam; and
    - a plurality of different zones which comprise mutually different aperture patterns arranged within the progenitor beam charged particle footprint;
  - direct said plurality of charged particle beams toward said specimen; and
  - select using a selector device located downstream of said aperture plate, a beam array from a chosen zone of said plurality of different zones to be directed onto the specimen.

10. A method according to claim 9, wherein:
in a first use session, a first of said plurality of different zones is selected to irradiate the specimen with a beam array in which each beam has a first beam current value;
in a second use session, a second of said plurality of different zones is selected to irradiate the specimen with a beam array in which each beam has a second, different beam current value.

11. A method according to claim 9, wherein:
said aperture plate is configured to comprise a zone having a singular through-hole, for allowing passage of a portion of said progenitor charged particle beam without subdividing it; and
said progenitor charged particle beam is directed onto said through-hole, so as to produce a single-beam operational mode of said apparatus.

12. An apparatus according to claim 2, wherein the apertures of a first zone of the at least two of the plurality of different zones have a first diameter, and the apertures of a second zone of the at least two of the plurality of different zones have a second diameter that is different from the first diameter.

13. A method according to claim 10, wherein said first plurality of different zones and said second plurality of different zones have an essentially identical aperture distribution.

14. A method according to claim 13, wherein the apertures of the first plurality of different zones have a first diameter, and the apertures of the second plurality of different zones have a second diameter that is different from the first diameter.

15. A method according to claim 11, wherein the selector device is configured to change the operational mode of said apparatus from a multibeam mode of operation to the single beam mode of operation by selecting beam array from the zone having a singular through-hole.

* * * * *